United States Patent [19]

Phy

[11] Patent Number: 4,751,199

[45] Date of Patent: Jun. 14, 1988

[54] PROCESS OF FORMING A COMPLIANT LEAD FRAME FOR ARRAY-TYPE SEMICONDUCTOR PACKAGES

[75] Inventor: William S. Phy, Los Altos Hills, Calif.

[73] Assignee: Fairchild Semiconductor Corporation, Cupertino, Calif.

[21] Appl. No.: 5,675

[22] Filed: Jan. 21, 1987

Related U.S. Application Data

[62] Division of Ser. No. 558,459, Dec. 6, 1983, abandoned.

[51] Int. Cl.⁴ ............................................. H05K 5/00
[52] U.S. Cl. ..................................... 437/209; 29/739; 29/832; 29/835; 437/220; 357/70; 174/52 R
[58] Field of Search ................... 29/588, 589, 832, 739, 29/835; 357/70, 68, 74, 80; 174/52 FP, 52 R; 437/209

[56] References Cited

U.S. PATENT DOCUMENTS

| | | | |
|---|---|---|---|
| 3,602,983 | 9/1971 | Bertioti et al. | 29/577 |
| 3,842,189 | 10/1974 | Southgate | 174/52.5 |
| 3,899,305 | 8/1975 | Hilgers et al. | 29/193 |
| 4,305,088 | 12/1981 | Narita et al. | 357/79 |
| 4,331,831 | 5/1982 | Ingram et al. | 357/70 |
| 4,420,767 | 12/1983 | Hodge et al. | 357/81 |
| 4,530,002 | 7/1985 | Kenai | 357/68 |

Primary Examiner—Brian E. Hearn
Assistant Examiner—Beverly A. Pawlikowski
Attorney, Agent, or Firm—Lee Patch; James A. LaBarre

[57] ABSTRACT

A lead frame that is suited for use on array types of integrated circuit packages to provide a high degree of compliance for absorbing mechanical stress induced by thermal changes includes a series of individual terminal elements that are connected in a strip form by means of break tabs disposed between adjacent elements. Each terminal element provides two spaced, generally parallel mounting surfaces that are resiliently connected to one another by means of an integral intermediate section. While the terminal elements are interconnected in strip form, one of the mounting surfaces of each element can be bonded to an associated attachment region on the semiconductor substrate. After all of the terminals of the strip have been so bonded, the break tabs between adjacent terminals can be removed to thereby separate the terminals from one another. The package which then results contains discrete compliant terminals which are suitable for subsequent surface attachment to the printed circuit board.

9 Claims, 1 Drawing Sheet

U.S. Patent    Jun. 14, 1988    4,751,199
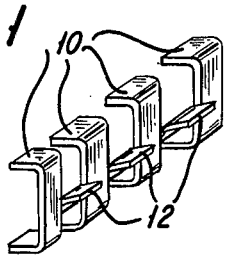
FIG.1
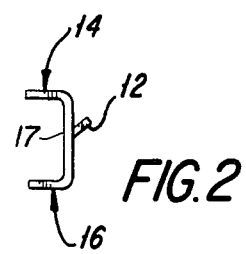
FIG.2
FIG.3
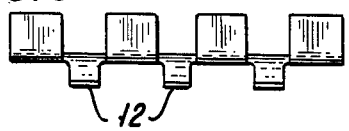
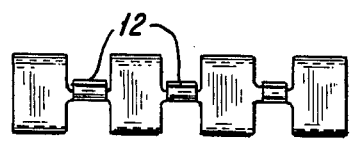
FIG.4
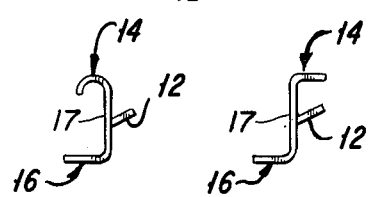
FIG.5   FIG.6
FIG.8
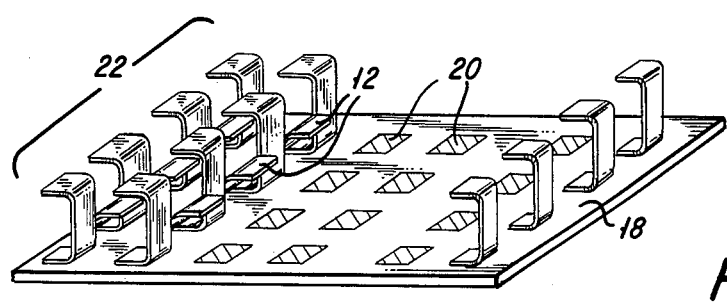
FIG.7

PROCESS OF FORMING A COMPLIANT LEAD FRAME FOR ARRAY-TYPE SEMICONDUCTOR PACKAGES

This application is a division of application Ser. No. 558,459, filed Dec. 6, 1983 now abandoned.

BACKGROUND OF THE INVENTION

The present invention relates to integrated circuit packages, and more specifically to a lead frame having terminals that connect an integrated circuit to a printed circuit board with a high degree of compliance to thereby withstand mechanical stress due to thermal changes.

In the mounting of an integrated circuit package on a printed circuit board, or similar such support surface, it is important that the means which physically and electrically interconnect these two structures provide a certain amount of compliance to account for differences in the expansion of the two structures under changing thermal conditions. If sufficient compliance is not provided, the mechanical stress which results when one of the two structures expands or contracts more than the other can lead to a failure of the bond between the two.

The achievement of adequate compliance between the integrated circuit package and the printed circuit board cannot be achieved by merely matching the coefficient of expansion of these two structures. While a perfect thermal expansion coefficient match between the package and the board could assure substantially reliable interconnection when the board and package are subjected to thermal cycling at a relatively low frequency, the bond can nevertheless fail during higher frequency power cycling. Among the factors which can contribute to such failure are the difference in the effective specific heats of the semi-conductor package and the printed circuit board, and the greater thermal radiating area of the board. In other words, because of the greater surface area of the board, it can dissipate heat more rapidly than the semiconductor package and thus may not increase in temperature in the area of the package/board bond as quickly as the package itself, leading to different rates of expansion. This difference in expansion in turn leads to stress in the area of the bond.

This stress must be capable of being absorbed in the bonding media and in the individual elements which make up the total circuit assembly. The most practical means for absorbing this stress is with a compliant interface between the semi-conductor package and the printed circuit board. The degree of compliance which this interface must possess should be such that the elastic limits of the various components and the bonding media are not exceeded under extreme conditions.

Of the presently available types of semiconductor packages, the peripheral leads that can be found on leaded chip carriers and formed lead flat packs provide such compliance to a limited degree. However, these lead arrangements are not suitable for use in array type semiconductor packages, wherein the attachment regions are arranged in a matrix pattern across one surface of the enclosure, rather than merely along the peripheral edges thereof.

Array type packages generally fall into one of three categories: the pin-grid, the pad-grid and the open-via. Of these three types, only the pin-grid arrangement provides any degree of compliance between the semiconductor package and the printed circuit board. However, this design requires a through-hole attachment, with which other limitations are associated. For example, this type of attachment poses alignment problems with respect to the board layers and the bonding pads of the package.

The pad-grid and open-via types of packages utilize a surface attachment rather than a through-hole attachment, which obviates these alignment problems. However, these types of packages, and more specifically the surface mounting arrangement associated with these packages, does not provide the required degree of compliance.

BRIEF STATEMENT OF THE INVENTION

Accordingly, it is an object of the present invention to provide a surface mount arrangement that is suited for use on array types of integrated circuit packages and which provides a high degree of compliance for absorbing the mechanical stress induced by thermal changes. In accordance with the present invention, this object is achieved with a lead frame that comprises a series of individual terminal elements that are connected in a strip form by means of break tabs disposed between adjacent elements. Each terminal element is appropriately shaped to provide two spaced, generally parallel mounting surfaces that are connected to one another by means of an integral intermediate section. While the terminal elements are interconnected in strip form, one of the mounting surfaces of each element can be bonded, for example brazed, to an associated attachment region on the semiconductor substrate. After all of the terminals of the strip have been so bonded, the break tabs between adjacent terminals can be removed to thereby separate the terminals from one another. The package which then results contains discrete compliant terminals which are suitable for subsequent surface attachment to the printed circuit board.

The lead frame can be constructed using conventional stamping tool technology. Furthermore, it can be selectively scored at desired lengths so as to provide individual strips having a predetermined number of terminals. The arrangement of the terminals in a linear strip form easily lends itself to continuous strip fabrication of the lead frame.

Further details and advantages of the invention will be apparent from the following description of the preferred embodiments of the invention illustrated in the accompanying drawings.

BRIEF DESCRIPTION OF THE DRAWINGS

FIG. 1 is a perspective view of a lead frame strip embodying the principles of the present invention;

FIG. 2 is an end-view of the lead frame strip of FIG. 1;

FIG. 3 is a top-view of the lead frame strip of FIG. 1;

FIG. 4 is a side view of the lead frame strip of FIG. 1;

FIG. 5 is an end view of a second embodiment of a lead frame strip;

FIG. 6 is an end view of a third embodiment of a lead frame strip;

FIG. 7 is a perspective view of a semiconductor package during the processing step in which the terminal elements are attached to the package; and FIG. 8 is a perspective view of a fourth embodiment of a terminal strip.

DESCRIPTION OF THE ILLUSTRATED EMBODIMENTS

In the following description of preferred embodiments of the invention illustrated in the accompanying drawings, particular reference is made to the use of the invention in connection with an array type semiconductor package, since this is one application for which the invention is particularly suited. However, it will be appreciated by those having familiarity with this technology that the practical applications of the invention are not so limited. Rather, the compliant terminals of the present invention can be used in other well-known semiconductor packages, such as dual-in-line (DIP) and leaded chip carriers.

Referring generally to FIGS. 1–4, and more specifically to FIG. 1, a compliant lead frame for surface mount semiconductor packages comprises a series of terminal elements 10 that are aligned and connected to one another in a spaced, side-by-side arrangement to form a strip comprised of a desired number of terminals. The terminals in the strip are interconnected by means of break tabs 12, one of which is connected between each two adjacent terminals in the strip.

As best shown in FIG. 2, each terminal element 10 can be a C shaped member that provides two spaced, generally parallel mounting surfaces 14 and 16 which respectively comprise the two legs of the member. These two legs are interconnected by means of a compliant, i.e. resilient, central section 17, with the two legs and the central section preferably being integrally formed from a single piece of conductive material. The break tabs 12 which connect the various terminal elements to form the strip are attached to the central section of the C-shaped member and oriented at an angle thereto. Of course, rather than being located at approximately the middle of the central section 17, as shown in FIG. 2, the break tabs can be connected to the terminal elements anywhere along their length.

As shown in FIGS. 5 and 6, configurations other than the C shape illustrated in FIG. 2 can be used for the terminal elements. For example, the terminal element could be formed into an inverted J shape, as shown in FIG. 5, or an essentially Z shape as shown in FIG. 6. Basically, any shape which provides two spaced and compliantly interconnected mounting surfaces for the semiconductor package and the printed circuit board, respectively, can be utilized for the terminal elements.

Advantageously, the terminal elements 10 and break tabs 12 that form the lead frame strip can be integral with one another. In the preferred embodiment of the invention, the lead frame is formed from a single strip of an appropriate metal, for example, Kovar ®, Alloy 42 or copper. This strip of metal can be suitably stamped and bent, using conventional technology, to form the terminal elements and the interposing break tabs. Preferably, the lead frame strip is scored at appropriate locations to enable a long strip to be segmented into several short strips each containing a number of terminal elements corresponding to the number of attachment sites in a row on the semiconductor package. For example, the scoring can be provided on each side of each break tab, not only to facilitate the segmenting of the long strip into several short strips, but also to enable the break tabs to be more easily removed from the strip once the terminal elements have been attached to the semiconductor package.

Referring to FIG. 7, an array type semiconductor package 18 includes bonding sites 20 that are arranged in a matrix pattern on one surface of the package. Attachment of the compliant terminals to the package is carried out while the terminals are present in the strip form shown in FIG. 1. More specifically, a strip 22 containing an appropriate number of terminals (four in the illustrated embodiment) is placed in contact with the package 18 so that one of the mounting surfaces 14 or 16 of each terminal in the strip engages each of the bonding sites 20 in a row of the matrix pattern. While in such an engagement, the terminals are bonded to the sites, for example by means of brazing, ultrasonic bonding, thermal compression or any other suitable technique. Once the bonding is completed and the lead frame strips are thereby suitably attached to the package, the break tabs 12 are removed from the strips, for example by twisting them about the longitudinal axis of each strip to break their connection to the terminal elements. With the break tabs removed, the resulting structure comprises a series of discrete terminals that are ready for surface attachment to the printed circuit board, as illustrated at the rightmost row of terminals on the semiconductor package of FIG. 7.

Due to the configuration of the terminals which provide two spaced mounting surfaces that are integrally interconnected, the interface between the semiconductor package and the printed circuit board has a high degree of compliance which can withstand and absorb substantial stresses which may be generated due to differences in thermal expansion of the semiconductor and the printed circuit board. Most of the compliance is available along two axes, i.e., within the plane of the paper with reference to FIGS. 2, 5, and 6. Since the stress which is generated is omnidirectional, it may be desirable to provide added compliance along the third axis. In such a case, greater compliance can be provided by rotating one of the legs of the terminal element 10 relative to the other, so as to provide a twist of about 90° in the intermediate section which connects them, as shown in FIG. 8.

It will be appreciated by those of ordinary skill in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning in range of equivalence thereof are intended to be embraced therein.

What is claimed is:

1. A method for attaching high compliance leads to a semiconductor package having bonding sites arranged in a matrix pattern on a surface thereof, for subsequent attachment to the surface of a printed circuit board having a corresponding matrix arrangement of mounting regions, comprising the steps of:

forming lead frames each comprised of a strip of terminal elements connected in a side-by-side arrangement by means of break tabs disposed between adjacent elements, each terminal element having a pair of spaced, resiliently interconnected mounting surfaces;

bonding one of the mounting surfaces of each terminal element on one of said frames to respective bonding sites in one row of the matrix pattern on the semiconductor package while said terminal elements are connected in strip form; and removing the break tabs from the lead frame after said bonding step to thereby separate said terminal elements from one another for subsequent attachment of the other mounting surface of each terminal element to a corresponding mounting region on the surface of a printed circuit board.

2. The method of claim 1 wherein said forming step comprises shaping a single piece of metal into a series of alternating and integral terminal elements and break tabs.

3. The method of claim 2, wherein each of said terminal elements is formed to be generally C-shaped.

4. The method of claim 2, wherein each of said terminal elements is formed to be generally J-shaped.

5. The method of claim 2, wherein each of said terminal elements is formed to be generally Z-shaped.

6. The method of claim 2, wherein each terminal element is formed to be compliant in two axes.

7. The method of claim 2, wherein each terminal element is formed by bending a strip of conducting material into a generally C-shaped structure having the two mounting surfaces formed on the legs thereof and connected by an intermediate base, and rotating one of said mounting surfaces about 90° relative to the other of said mounting surfaces to provide a twist in said intermediate base.

8. The method of claim 7, wherein the resulting terminal element is compliant in three axes.

9. A method for mounting an integrated circuit package having bonding sites arranged in a matrix pattern on one surface thereof to a printed circuit board having a corresponding matrix arrangement of mounting regions in a manner which provides mechanical compliance to absorb stresses caused by relative movement between the integrated circuit package and the printed circuit board, comprising the steps of:

forming a conductive material into a plurality of lead frame strips each of which comprises a linear array of terminal elements having two spaced, generally parallel mounting surfaces interconnected by a resilient intermediate section and break tabs interposed between and connected to adjacent terminal elements;

placing lead frame strips on respective rows of bonding sites on said integrated circuit package such that one mounting surface on each terminal element in a strip engages a corresponding bonding site in its respective row of the matrix pattern;

bonding said one mounting surface of each terminal to the bonding site which it engages;

twisting said break tabs and removing them from said strips to thereby separate the terminal elements in each strip from one another; and bonding the other mounting surface of each terminal element to a corresponding mounting region on said printed circuit board.

* * * * *